United States Patent [19]

Klimanis et al.

[11] Patent Number: 5,283,481
[45] Date of Patent: * Feb. 1, 1994

[54] BIPOLAR ELEMENT BIFET ARRAY DECODER

[75] Inventors: Vilnis Klimanis; Frank A. Montegari, both of Wappingers Falls, N.Y.

[73] Assignee: International Business Machines Corporation, Armonk, N.Y.

[*] Notice: The portion of the term of this patent subsequent to Jul. 14, 2009 has been disclaimed.

[21] Appl. No.: 633,771

[22] Filed: Dec. 26, 1990

[51] Int. Cl.$^5$ ............... H03K 19/20; H03K 19/082; H03K 19/092; H03K 19/08; G06F 9/22; G11C 11/409
[52] U.S. Cl. ..................... 307/449; 307/463; 307/449; 307/465; 365/230.06
[58] Field of Search ............... 307/449, 446, 475, 463; 365/230.06

[56] References Cited

U.S. PATENT DOCUMENTS

| | | | |
|---|---|---|---|
| 4,697,109 | 9/1987 | Homma et al. | 307/450 |
| 4,777,390 | 10/1988 | Hoshi | 307/463 X |
| 4,878,195 | 10/1989 | Bocquet | 307/463 X |
| 4,950,925 | 8/1990 | Doi et al. | 307/446 |
| 4,961,011 | 10/1990 | Ide et al. | 307/451 |
| 4,975,597 | 12/1990 | Houston | 365/230.01 X |
| 5,018,107 | 5/1991 | Yoshida | 365/230.06 |
| 5,021,688 | 6/1991 | Leforestier et al. | 307/463 |
| 5,022,010 | 6/1991 | Chan | 365/230.06 |
| 5,109,167 | 4/1992 | Montegari | 307/463 |

OTHER PUBLICATIONS

Takada et al., IEEE International Symposium on Circuits and Systems, vol. 3, May 1990, pp. 1995-1998, *A 5ns 1Mb BiCMOS SRAM with ECL I/O Interface*, p. 1996.

*Primary Examiner*—Edward P. Westin
*Assistant Examiner*—Andrew Sanders
*Attorney, Agent, or Firm*—Sterne, Kessler, Goldstein & Fox

[57] ABSTRACT

A decoder implemented using bifet technology to exhibit high performance, high density, and low power dissipation. The decoder has multiple input lines for conducting signals at ECL-compatible voltage levels and an output line for conducting signals at CMOS-compatible voltage levels. The output line is enabled in response to a predetermined combination of ECL-compatible voltage level signals on said input lines. The decoder comprises a gate for generating an OR output at ECL-compatible voltage levels according to the input line signals. An inverter is coupled to the OR gate for inverting and amplifying the OR output to produce an inverted output at CMOS voltage levels. A word line driver is coupled to an output of the inverter for isolating and driving the output line according to the inverted output. Finally, power saving means are coupled to the inverter for minimizing power dissipation in the decoder.

29 Claims, 9 Drawing Sheets

Figure 3 — PRIOR ART

BIPOLAR ELEMENT BIFET ARRAY DECODER

CROSS-REFERENCE TO OTHER APPLICATIONS

The following application of common assignee contains some common disclosure, and is believed to have an effective filing date identical with that of the present application:

PNP WORD LINE DRIVER Ser. No. 07/635,865, filed Dec. 28, 1990, now U.S. Pat. No. 5,109,167.

BACKGROUND OF THE INVENTION

1. Field Of The Invention

The present invention relates generally to decoders, and more particularly to decoders which are achieved using bifet technology.

2. Related Art

A decoder is a device having input and output lines. The decoder selects one of its output lines according to the combination of values present on its input lines. When selecting an output line, the decoder sets the output line to either a low voltage value or a high voltage value, depending on whether the output lines are high or low, respectively, when not selected by the decoder. As used herein, the terms "select" and "enable" are used interchangebly.

Decoders are often used as access controllers for memory devices. This is shown in FIG. 1, where a decoder 104 controls access to a memory device 108.

The decoder 104 has N input lines 102 and $2^N$ output lines 106 (the output lines 106 are also called word/bit lines 106 when the decoder 104 is used as an access controller as shown in FIG. 1). The memory device 108 has $2^N$ rows and W memory cells per row. A one-to-one correspondence exists between the $2^N$ word/bit lines 106 and the $2^N$ rows of the memory device 108.

Ordinarily, the decoder 104 maintains the word/bit lines 106 in an unenabled state. When it is desired to read from or write to a row 114 of the memory device 108, an address of the row 114 is placed on the input lines 102. In response to the address, the decoder 104 enables a word/bit line 116 which corresponds to the row 114. The decoder 104 maintains the other word/bit lines in the unenabled state. Once the word/bit line 116 is enabled, it is possible to either read from or write to the memory cells associated with the row 114 by means of data lines 110. A selection line 112 may be provided to select specific memory cells in the row 114 for reading and writing.

A conventional decoder 104' is shown in FIG. 2. The conventional decoder 104' contains first decoders 212, 214 and second decoders 202.

The first decoders 212, 214 each contain four input lines 216, 218 (which correspond to the input lines 102 in FIG. 1) and sixteen output lines 226, 228.

While only one second decoder 202 is shown in FIG. 2, in practice the conventional decoder 104' contains 256 second decoders 202. The second decoders 202 contain word/bit lines 224, which correspond to the word/bit lines 106 in FIG. 1.

The second decoder 202 contains only metal oxide semiconductor field effect transistors (MOSFET), and specifically negative field effect transistors (NFET) 208, 210 and positive field effect transistors (PFET) 204, 206. Circuits using metal oxide semiconductor NFETs and PFETs are often called complementary metal oxide semiconductors (CMOS).

The second decoder 202 has two input nodes 230, 232. The output lines 226, 228 are connected to the input nodes 230, 232, which are in turn connected to the gates of the NFETs 208, 210 and the PFETs 204, 206. Each of the second decoders 202 is connected to and receives input from a different combination of the output lines 226, 228.

In operation, an 8 bit address is divided into two 4 bit addresses. The two 4 bit addresses are applied to the first decoders 212, 214 on the input lines 216, 218. Normally, the first decoders 212, 214 maintain the output lines 226, 228 at a high voltage state, such that the output lines 226, 228 are not enabled. In response to the 4 bit addresses, the first decoders 212, 214 each cause one of their respective output lines 226, 228 to go to a low voltage state, such that the output lines 226, 228 in the low voltage state are enabled.

For any particular second decoder 202, if either or both of its input nodes 230, 232 (which are connected to the output lines 226, 228) are in a high voltage state, then either or both NFETs 208, 210 are conductive, and at least one of the PFETs 204, 206 is nonconductive. As a result, the word/bit line 224 is pulled down to a low voltage state, such that the word/bit line 224 is not enabled.

If the input nodes 230, 232 are both at a low voltage state, then the NFETs 208, 210 are nonconductive and the PFETs 204, 206 are conductive. As a result, the word/bit line 224 is pulled up to a high voltage state, such that the word/bit line 224 is enabled.

While representing a functional decoder 104, the conventional decoder 104' is flawed with respect to performance and density. Specifically, the conventional decoder 104' is relatively slow in operation because it uses only field effect transistors (FET) 204, 206, 208, 210. In general, FETs are relatively slower than other transistor types (such as bipolar). Also, the density of the conventional decoder 104' is relatively low because FETs are physically larger than other transistor types (such as bipolar) for the same driving capability.

Another conventional decoder 104" is shown in FIG. 3. The conventional decoder 104" contains the first decoders 212, 214. The structure and operation of the first decoders 212, 214 are as described above with reference to FIG. 2.

The conventional decoder 104" also contains second decoders 322. While only one second decoder 322 is shown in FIG. 3, in practice the conventional decoder 104" contains 256 second decoders 322. The second decoders 322 contain word/bit lines 314, which correspond to the word/bit lines 106 in FIG. 1.

The second decoder 322 contains only bipolar transistors 304, 306, 308. The second decoder 322 has two input nodes 324, 326. The output lines 226, 228 are connected to the input nodes 324, 326, which are in turn connected to the bases of the bipolar transistors 306, 308. Each of the second decoders 322 is connected to and receives input from a different combination of the output lines 226, 228.

In operation, an 8 bit address is divided into two 4 bit addresses. The two 4 bit addresses are applied to the first decoders 212, 214 on the input lines 216, 218. Normally, the first decoders 212, 214 maintain the output lines 226, 228 at a high voltage state, such that the output lines 226, 228 are not enabled. In response to the 4 bit addresses, the first decoders 212, 214 each cause one of their respective output lines 226, 228 to go to a low voltage state, such that the output lines 226, 228 in the low voltage state are enabled.

The bipolar transistors 306, 308 represent a NOR gate. The bipolar transistor 304 represents an emitter follower.

For any particular second decoder 322, if either or both of its input nodes 324, 326 are at a high voltage state, then at least one of the bipolar transistors 306, 308 is conductive. Consequently, the base of the bipolar transistor 304 is held at a low voltage state. As a result, the word/bit line 314 is pulled down to a low voltage state, such that the word/bit line 314 is not enabled.

If the input nodes 306, 308 are both at a low voltage state, then the bipolar transistors 306, 308 are nonconductive. Consequently, the base of the bipolar transistor 304 is pulled up to a high voltage state. As a result, the word/bit line 314 is pulled up to a high voltage state, such that the word/bit line 314 is enabled.

The conventional decoder 104" represents a functional decoder 104. Also, because it uses only bipolar transistors 304, 306, 308, the conventional decoder 104" solves the performance and density problems of the conventional decoder 104' since bipolar transistors are generally faster and physically smaller than FETs for the same driving capability.

However, the conventional decoder 104" is flawed with respect to power dissipation. As shown in FIG. 3, the second decoders 322 always draw a significant amount of current. For example, while in the nonenabled state, the second decoders 322 draw current (and dissipate power) through the bipolar transistors 306, 308. While in the enabled state, the second decoders 322 draw current (and dissipate power) through the bipolar transistor 304.

Therefore, a decoder is required which achieves high performance, high density, and minimal power dissipation.

SUMMARY OF THE INVENTION

The present invention comprises a decoder implemented using bifet technology to exhibit high performance, high density, and low power dissipation. The decoder has multiple input lines for conducting signals at ECL-compatible voltage levels and an output line for conducting signals at CMOS-compatible voltage levels. The output line is enabled in response to a predetermined combination of ECL-compatible voltage level signals on said input lines. The decoder comprises a gate for generating an OR output at ECL-compatible voltage levels according to the input line signals. An inverter is coupled to the OR gate for inverting and amplifying the OR output to produce an inverted output at CMOS voltage levels. A word line driver is coupled to an output of the inverter for isolating and driving the output line according to the inverted output. Finally, power saving means are coupled to the inverter for minimizing power dissipation in the decoder.

Preferably, the OR gate comprises a plurality of bipolar transistors coupled to the input lines and a gate output node to provide the OR output. The inverter comprises field effect transistors having inputs connected to the OR output. More preferably, the plurality of bipolar transistors are NPN transistors whose bases are connected to the input lines and whose emitters are connected together at the OR output. The field effect transistors comprise a PFET transistor and an NFET transistor connected in series and having their gates connected together at the OR output. The word line driver comprises a bipolar NPN emitter follower transistor whose base is connected to the inverter output and whose emitter is connected to the output line; and a second NFET transistor for pulling the output line down to a low voltage level when the inverter output is low. Finally, the power saving means comprises a third NFET transistor whose gate is connected to a clock signal input and whose drain is connected to the OR output, such that minimal current flows in the decoder when the clock signal is low.

More specifically, the invention comprises an N-to-$2^N$ decoder having N address lines and $2^N$ word lines, for individually enabling the word lines according to values on the address lines. The address lines conduct signals at ECL voltage levels and the word lines conduct signals at CMOS-compatible voltage levels. The decoder comprises a first decoder for translating a binary address on the address lines to a hexidecimal value; and $2^N$ second decoders for translating the hexidecimal value to a decimal value by enabling one of the word lines. Each of the second decoders in turn comprises a clock signal; multiple input lines for receiving the hexidecimal value; an output line corresponding to one of the word lines; an OR gate for generating an OR output at ECL-compatible voltage levels according to values on the input lines; an inverter for inverting and amplifying the OR output to produce an inverted output at CMOS voltage levels; a word line driver for isolating and driving the output line according to the inverted output; and a power saving transistor for minimizing power dissipation.

FEATURES AND ADVANTAGES OF THE INVENTION

The present invention provides novel decoders which incorporate the advantageous features of FET decoders and bipolar decoders. In particular, the decoders of the present invention are useful for achieving high performance, high density, and minimal power dissipation.

Another feature of the present invention is that it uses metal oxide semiconductor (MOS) field effect transistors (FETs) and bipolar transistors to provide decoders which are useful for converting from emitter coupled logic (ECL) voltage levels and ECL-compatible voltage levels to CMOS-compatible voltage levels. Circuits which use both FETs and bipolar transistors are often called bifet (or bicmos) circuits.

The decoders of the present invention are useful for driving long word lines upon which multiple CMOS devices, such as memory cells, may be attached. By using FETs, the decoders of the present invention exhibit low power dissipation.

Further features and advantages of the present invention, as well as the structure and operation of various embodiments of the present invention, are described in detail below with reference to the accompanying drawings, and in the claims. In the drawings, like-reference numbers refer to like-structural components and like-method steps.

BRIEF DESCRIPTION OF THE DRAWINGS

The present invention will be described with reference to the accompanying drawings, wherein.

DESCRIPTION OF THE PREFERRED EMBODIMENTS

The present invention is directed to decoders which are implemented using bifet technology.

Figure 1:
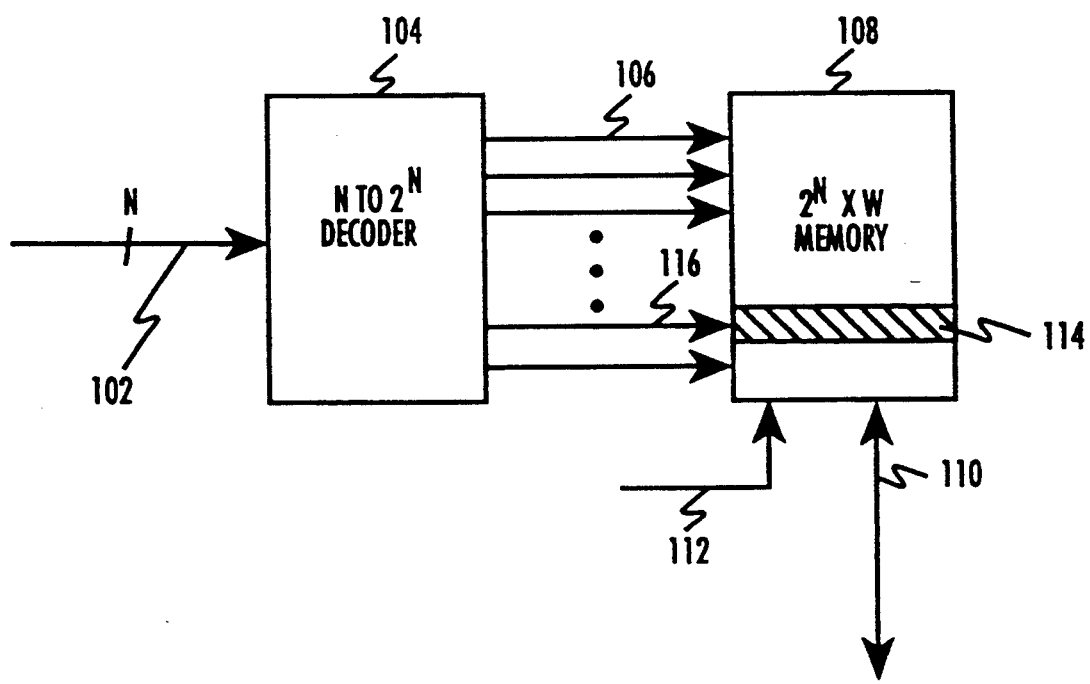
FIG. 1 illustrates a hardware environment in which the present invention may be utilized.
Figure 2:
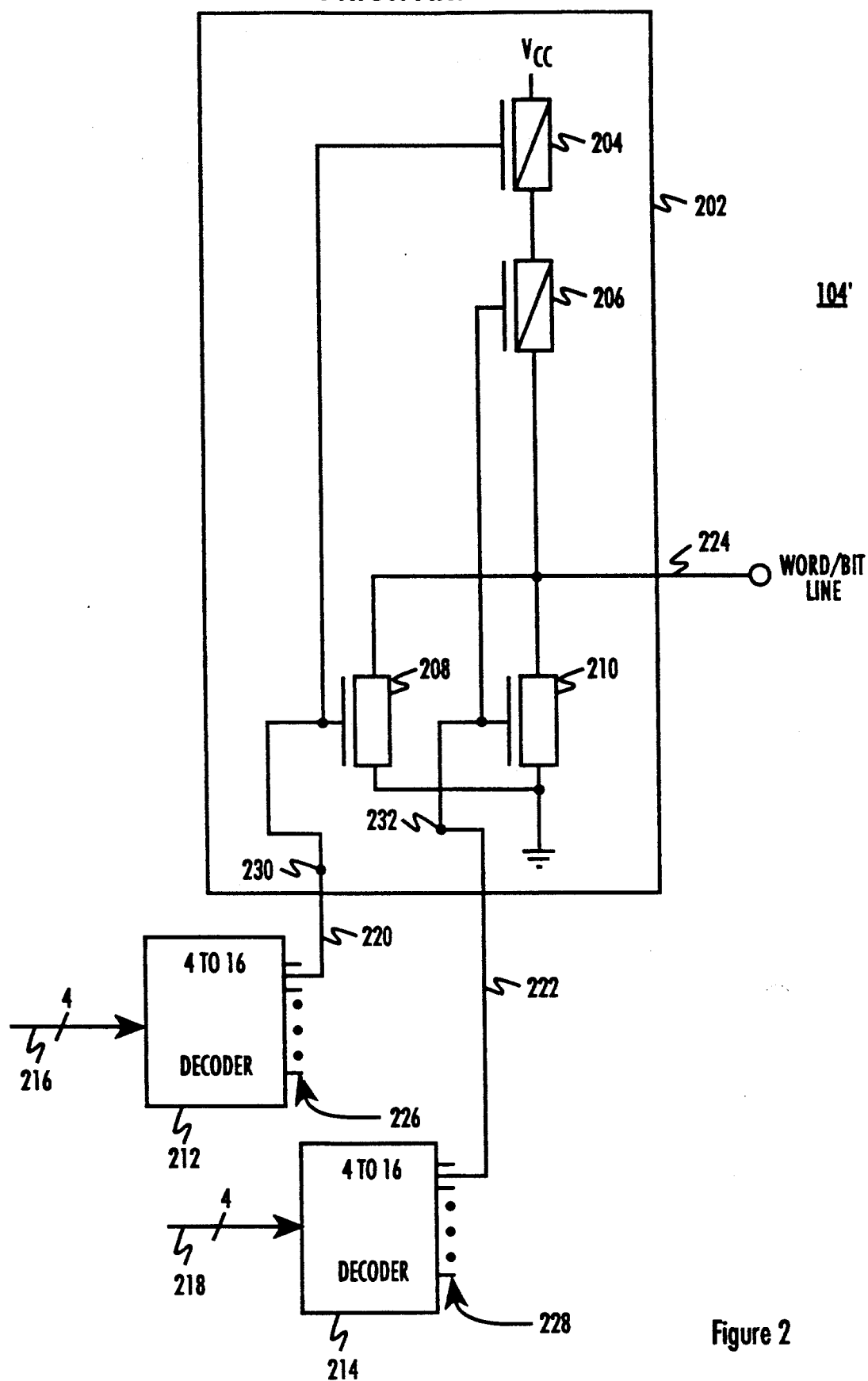
FIG. 2 illustrates a conventional FET decoder.
Figure 3:
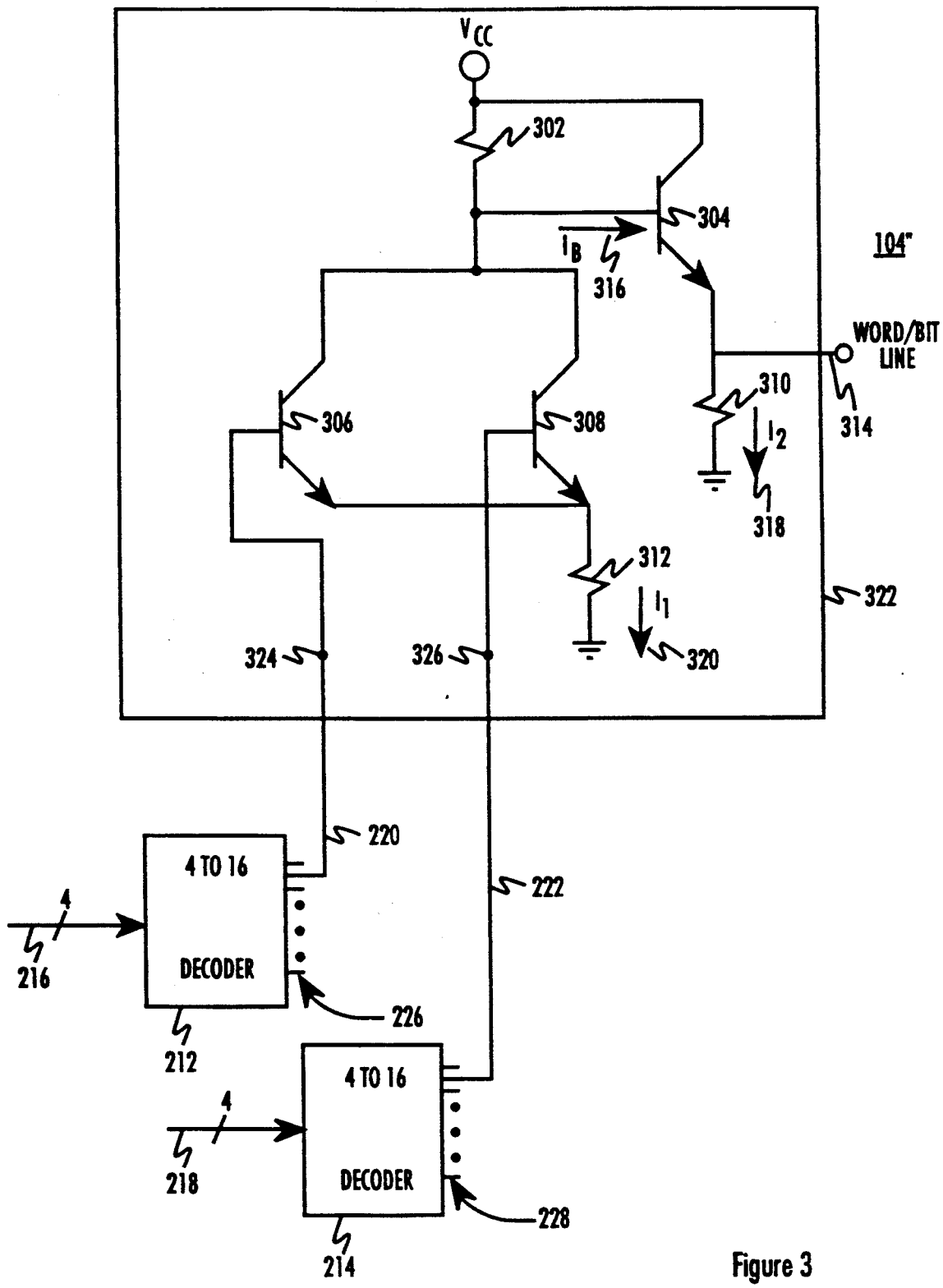
FIG. 3 illustrates a conventional bipolar decoder.

In the following description of the preferred embodiments of the present invention, reference is sometimes made to the use of the present invention as access controllers for memory devices as shown in FIG. 1. Such reference is made for the purpose of facilitating an understanding of the inventive concepts and their applications of the present invention. However, those with ordinary skill in the applicable art will appreciate that decoders are useful in other applications. Thus, the illustrative references to access controllers for memory devices are not intended in any way to be a limitation on the present invention or its applications.

Figure 4:
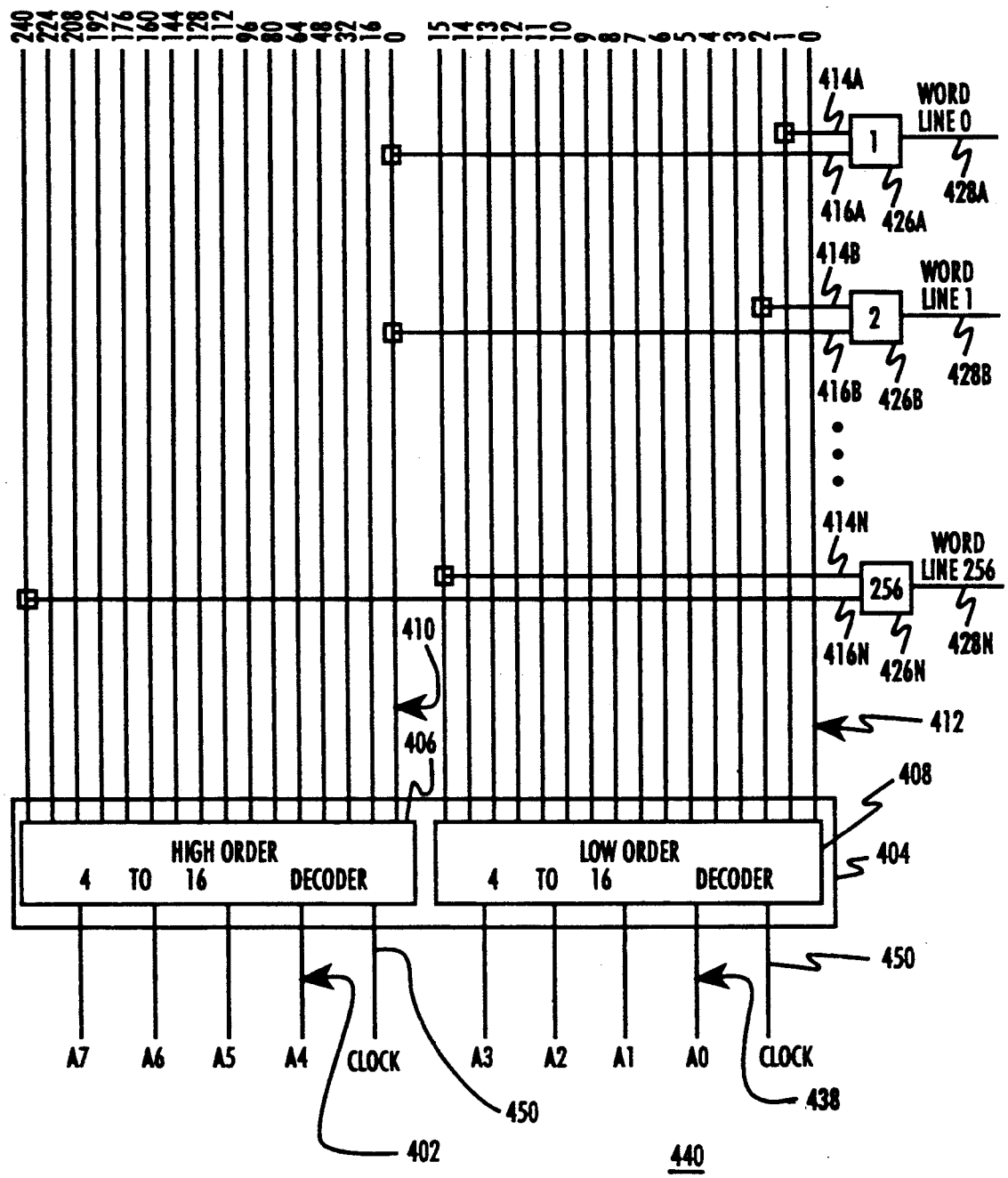
FIG. 4 illustrates a high-level structural diagram of a preferred embodiment of the present invention.

A high-level structural diagram of a preferred embodiment of the present invention is shown in FIG. 4. The preferred embodiment shown in FIG. 4 represents an 8-to-256 decoder 440. Those skilled in the applicable art will understand how to use the teachings of the present disclosure to make and use decoders of sizes other than 8-to-256.

The decoder 440 of the present invention contains a first decoder 404 and second decoders 426. The first decoder 404 contains a high-order 4-to-16 decoder 406 and a low-order 4-to-16 decoder 408. The high-order and low-order decoders 406, 408 each have 4 input or address lines 402, 438 and 16 output lines 410, 412.

While only three second decoders 426a, 426b, 426n are explicitly shown in FIG. 4, in practice the decoder 440 contains 256 second decoders 426, all having the same structure and operation. Each second decoder 426 has two input lines 414, 416; see, for example, input lines 414a, 416a of the second decoder 426a. One input line 414 is connected to one of the output lines 412 of the low-order decoder 408. The other input line 416 is connected to one of the output lines 410 of the high-order decoder 406. In practice, the input lines 414, 416 of each second decoder 426 are connected to a different combination of the output lines 410, 412 of the 4-to-16 decoders 406, 408. The second decoders 426 also have an output or word line 428; see, for example, output line 428a of the second decoder 426a.

In operation, an 8-bit binary address is placed on the input lines 402, 438 of the first decoder 404. The voltages at the input lines 402, 438 are at ECL levels (that is, approximately +0.5 to −0.5 volts). In response to the 8-bit binary address on the input lines 402, 438, the decoder 440 enables one of the output or word lines 428 of the second decoders 426. The other 255 word lines are unenabled. Thus, the decoder 440 essentially translates from 8-bit binary values on the input lines 402, 438 to decimal values on the word lines 428.

In the preferred embodiment of the present invention, the enabled word line is pulled-up to a high voltage level. The unenabled word lines are pulled-down to a low voltage level. The voltages at the word lines 428 are at CMOS-compatible levels.

The operation of the decoder 440 will now be described in greater detail. An 8-bit binary address is divided into a low-order 4-bit binary address and a high-order 4-bit binary address. The low-order 4-bit address is applied to the input 438 of the low-order decoder 408 and the high-order 4-bit address is applied to the input 402 of the high-order decoder 406.

In response to the low-order 4-bit address, the low-order decoder 408 enables one of its 16 output lines 412. The other 15 output lines 412 are unenabled.

Similarly, in response to the high-order 4-bit address, the high-order decoder 406 enables one of its 16 output lines 410. The other 15 output lines 410 are unenabled. Therefore, in response to the 8-bit address, the first decoder 404 enables two of its 16 output lines 410, 412.

Thus, the first decoder 404 essentially translates from 8-bit binary values on the input lines 402, 438 to hexidecimal values on the output lines 410, 412.

In the preferred embodiment of the present invention, while in the unenabled state, the output lines 410, 412 from the first decoder 404 are pulled-up to a high voltage level. While in the enabled state, the output lines 410, 412 are pulled-down to a low voltage level. The voltages at the output lines 410, 412 are at ECL-compatible levels (that is, approximately +0.5 to −1.3 volts). Note that the voltage levels corresponding to the enabled and unenabled states differ at the output lines 410, 412 connected to the first decoder 404 and the word lines 428 connected to the second decoders 426.

The high-level operation of the second decoders 426 will be described now with reference to the second decoder 426a.

As shown in FIG. 4, the input lines 416a, 414a of the second decoder 426a are connected to the output lines 410, 412 of the first decoder 404. If the voltage level on at least one of the input lines 414a, 416a is high (that is, at least one of the output lines 410, 412 connected to the input lines 416a, 414a is unenabled), then the second decoder 426a maintains its word line 428a in an unenabled state. If the voltage level on both of the input lines 414a, 416a is low (that is, the output lines 410, 412 connected to the input lines 416a, 414a are enabled), then the second decoder 426a enables its word line 428a.

Since only two of the output lines 410, 412 are enabled at any one time, and since the second decoders 426 are connected to different combinations of the output lines 410, 412, it is apparent that only one of the word lines 428 is enabled for any 8-bit binary address placed on the input lines 402, 438. Therefore, the preferred embodiment of the present invention shown in FIG. 4 realizes an 8-to-256 decoder.

The first decoder 404 will now be described in greater detail with reference to FIGS. 5, 6, and 7.

Figure 5:
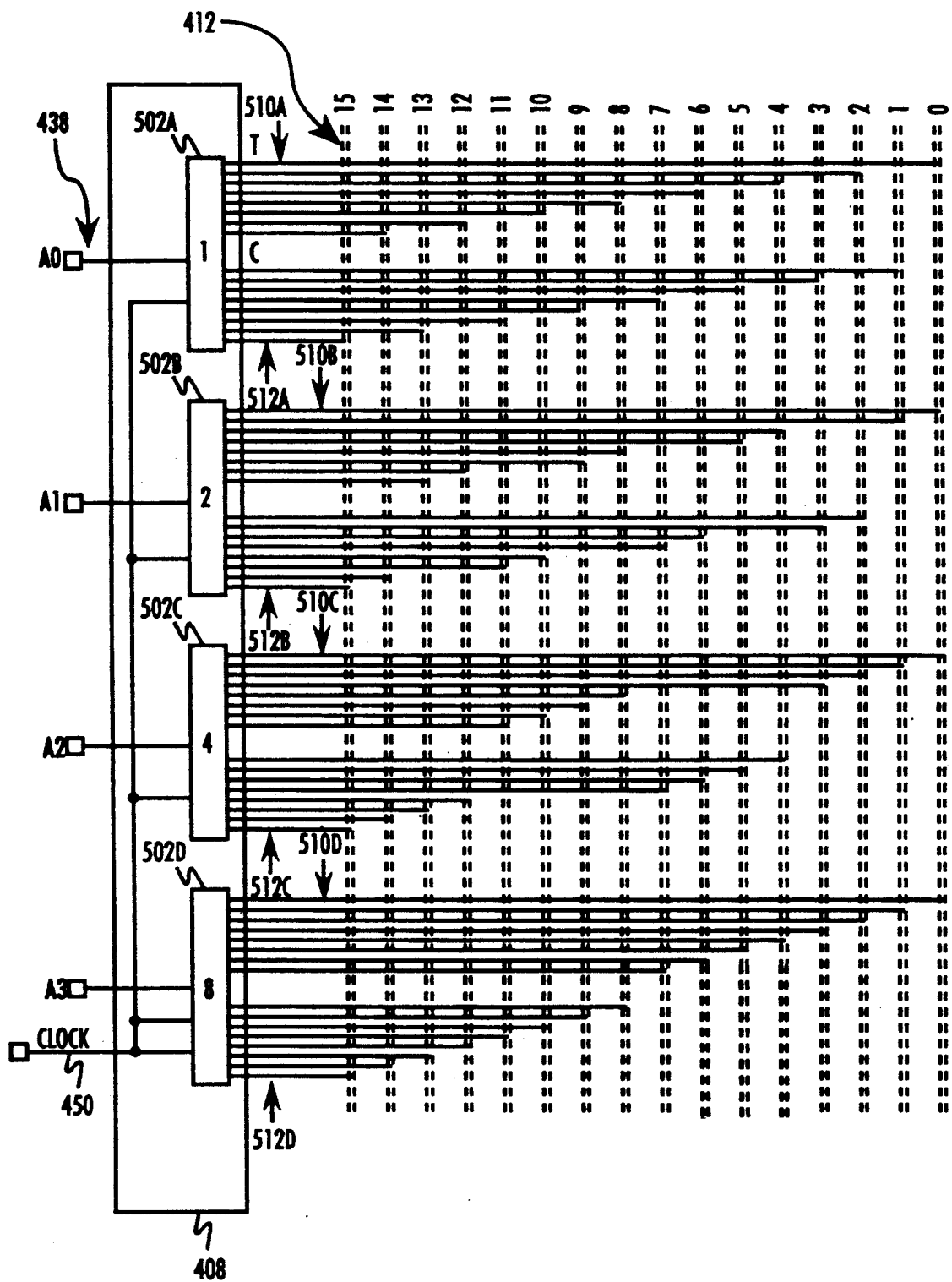
FIG. 5 illustrates a detailed structural diagram of a low-order decoder of the present invention.

FIG. 5 provides a detailed structural diagram of the low-order decoder 408 of the first decoder 404. FIG. 5 also illustrates the manner in which the low-order decoder 408 is connected to the output lines 412.

As shown in FIG. 5, the low-order decoder 408 contains four true/complement generators 502a, 502b, 502c, 502d. The true/complement generators 502 are each connected to a different input line 438. The true/complement generators 502 are also connected to a clock input 450. Each true/complement generator 502 has a number of true output lines 510a, 510b, 510c, 510d and complement output lines 512a, 512b, 512c, 512d.

In operation, the true/complement generators 502 generate true values of their respective inputs 438 on their respective true output lines 510. The true/complement generators 502 also generate complemented values of their respective inputs 438 on their respective complement output lines 512. For example, if the input A0 to the true/complement generator 502a is high, then the true output lines 510a would be high and the complement output lines 512a would be low.

The true output lines 510 and the complement output lines 512 are connected to the output lines 412 in a manner which ensures that a different output line 412 is enabled for each different combination of inputs present at the input lines 438. For example, if inputs A0=A1=A2=A3=low, then output line 0 is enabled. If inputs A0=high and A1=A2=A3=low, then output line 1 is enabled. Output lines 0 and 1 are unenabled for all other combinations of values on the input lines 438.

Figure 6:
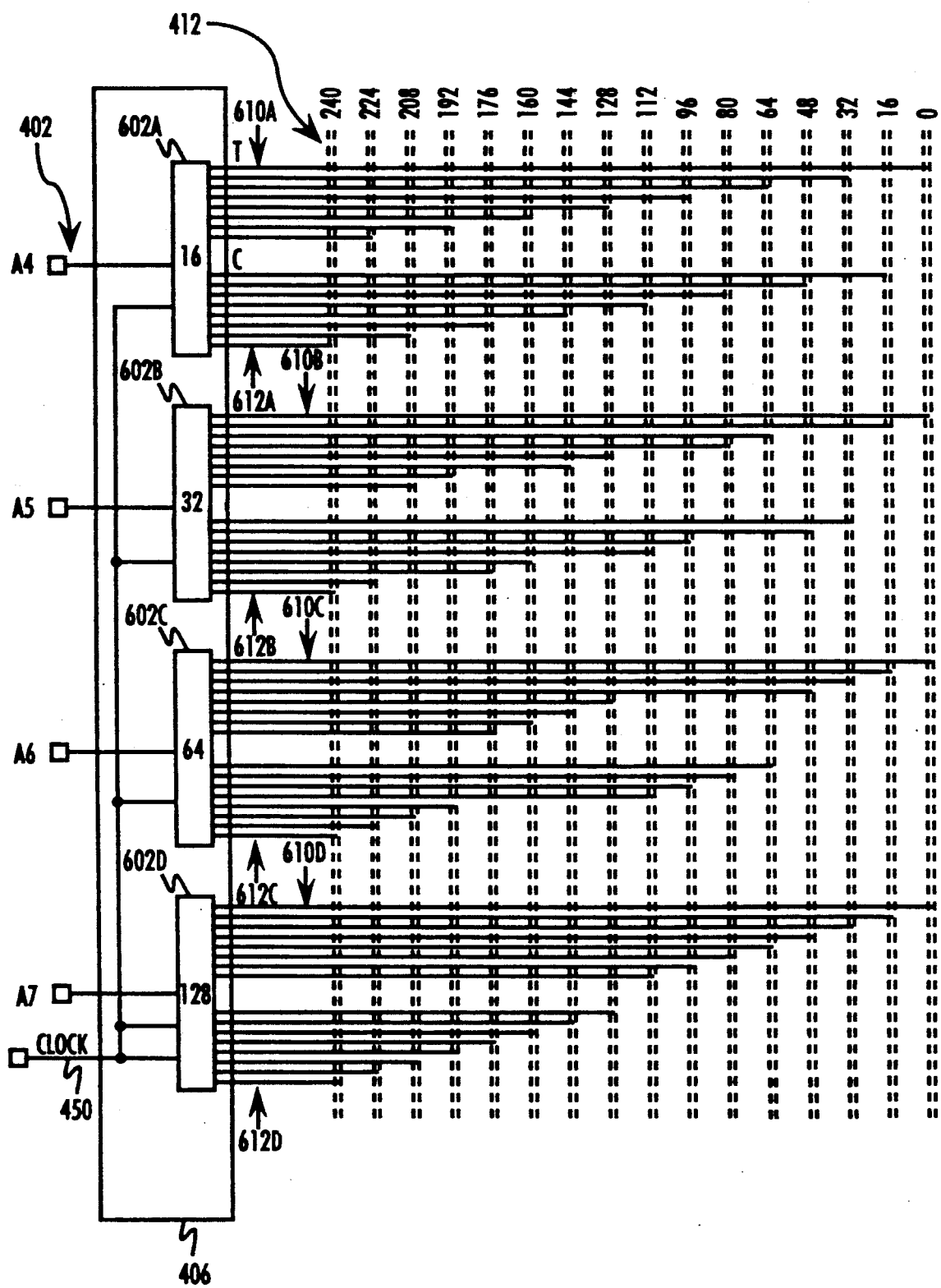
FIG. 6 illustrates a detailed structural diagram of a high-order decoder of the present invention.

FIG. 6 provides a detailed structural diagram of the high-order decoder 406 of the first decoder 404. FIG. 6 also illustrates the manner in which the high-order decoder 406 is connected to the output lines 410. The structure and operation of the high-order decoder 406 is similar to that of the low-order decoder 408. Therefore, for a discussion of the structure and operation of the high-order decoder 406, refer to the discussion above regarding the low-order decoder 408.

Figure 7:
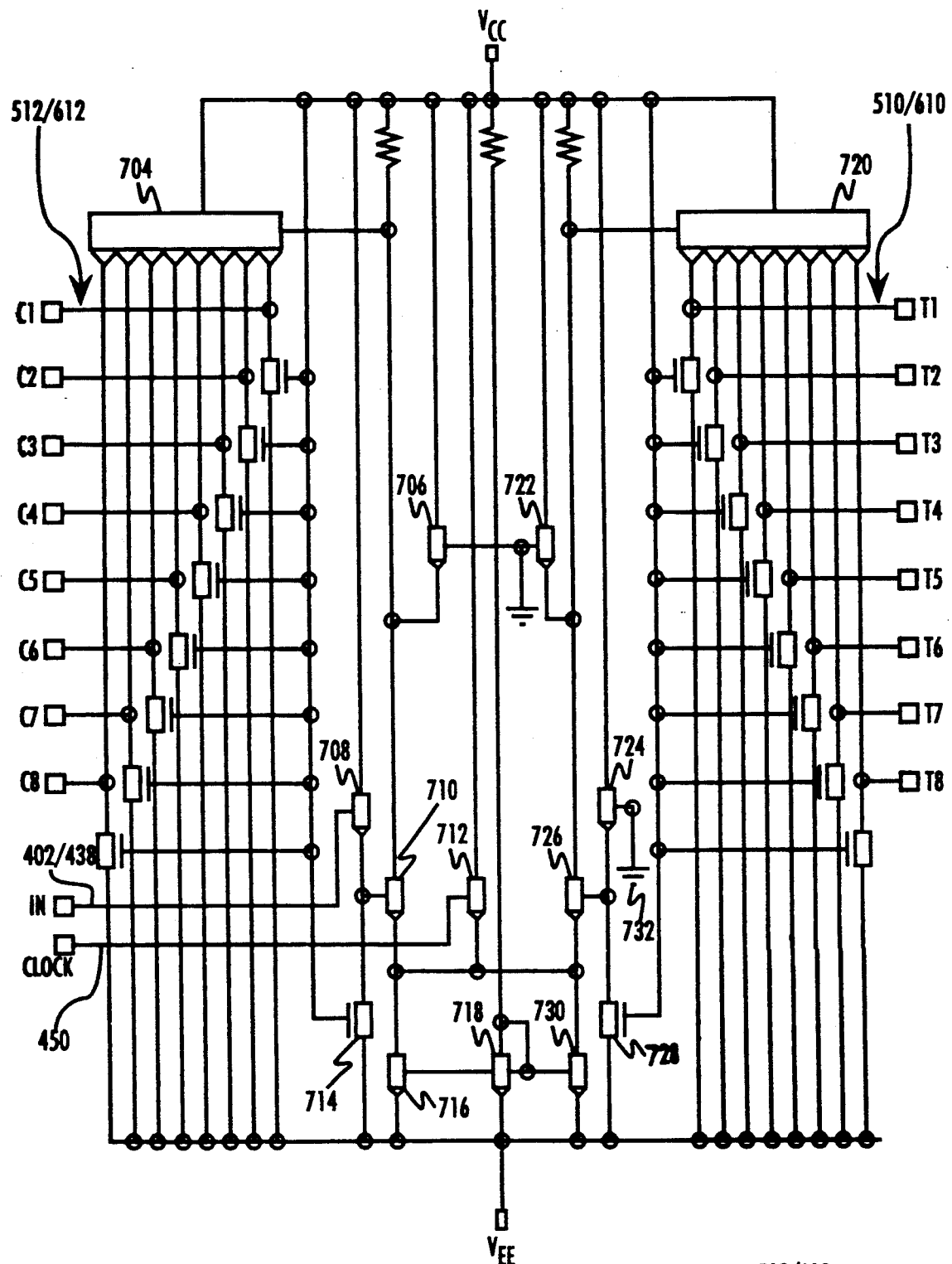
FIG. 7 illustrates a detailed structural diagram of a true/complement generator of the present invention.

FIG. 7 provides a detailed structural diagram of the true/complement generator 502, 602.

The true/complement generator 502, 602 contains bipolar NPN transistors 706, 708, 710, 712, 716, 718, 722, 724, 726, 730. The true/complement generator 502, 602 further contains bipolar NPN emitter followers having multiple emitters 704, 720. The true/complement generator 502, 602 still further contains multiple NFET transistors, including NFET transistors 714, 728.

The true/complement generator 502, 602 has an input 402/438, which corresponds to one of the input lines 402, 438. The true/complement generator 502, 602 also has a number of true output lines T1-T8, which correspond to one of the sets of true output lines 510, 610, and a number of complement output lines C1-C8, which correspond to one of the sets of complement output lines 512, 612. The true/complement generator 502, 602 further has the clock input 450.

In operation, the true/complement generator 502, 602 generates true values of the input 402/438 on the true output lines T1-T8, and generates complemented values of the input 402/438 on the complement output lines C1-C8.

The operation of the true/complement generator 502, 602 will now be described in greater detail.

Transistors 716, 718, 730 essentially operate as a current source. Specifically, the collective operation of transistors 716, 718, 730 ensures that current is always flowing through at least one of the transistors 710, 712, 726 (that is, at least one of the transistors 710, 712, 726 is active at all times).

When transistors 724, 726 are active, their emitters are held at approximate voltages of $-0.8$ and $-1.6$, respectively. This is the case since (1) the base of transistor 724 is tied to ground; (2) the transistors 724, 726 are emitter followers; and (3) the base to emitter voltage drop ($V_{BE}$) of bipolar NPN transistors is approximately 0.8 volts.

Suppose the input 402/438 is high (that is, the input 402/438 is at a voltage of $+0.5$ volts). When the input 402/438 is high, the transistors 708, 710 are active. Their emitters are held at approximate voltages of $-0.3$ and $-1.1$, respectively.

The emitters of transistors 710, 726 are tied together at node 734. Since this node is at $-1.1$ volts when the input 402/438 is high, transistors 724, 726 are not fully active.

Since transistors 708, 710 are active and are pulling current from $V_{CC}$ to $V_{EE}$, the base of transistor 704 is pulled down. Since transistor 704 is an emitter follower with multiple emitters, the complement output lines C1-C8 are also pulled down. Thus, when the input 402/438 is high, the complement lines C1-C8 are low.

Since transistors 724, 726 are not fully active and are not pulling substantial amounts of current from $V_{CC}$ to $V_{EE}$, the base of transistor 720 is pulled up. Since transistor 720 is an emitter follower with multiple emitters, the true output lines T1-T8 are also pulled up. Thus, when the input 402/438 is high, the true output lines T1-T8 are high.

The operation of the true/complement generator 502, 602 when the input 402/438 is low (that is, when the input 402/438 is at an approximate voltage of $-0.5$ volts) is analogous to that when the input 402/438 is high.

As noted above, the voltages at the output lines 410, 412 are at ECL-compatible levels. The voltages at the true output lines T1-T8 and the complement output lines C1-C8 are also at ECL-compatible levels.

In the preferred embodiment of the present invention, the first decoder 404 processes addresses on input lines 402, 438 only when the clock input 450 is low (that is, when the clock input 450 is at approximately $-1.3$ volts). Referring again to FIG. 7, the emitter of transistor 712 attempts to go down to $-2.1$ volts when the clock input 450 is low. Thus, transistor 712 does not affect the operation of transistors 710, 726 when the clock input 450 is low.

However, when the clock input 450 is high (that is, when the clock input 450 is at approximately $+0.5$ volts), transistor 712 is active. During this time, the emitter of transistor 712 is at approximately $-0.3$ volts. As a result, transistors 710, 726 are both substantially inactive. Therefore, the true/complement generator 502, 602 is inactive while the clock input 450 is high. The true/complement generator 502, 602 is active while the clock input 450 is low.

The structure and operation of the second decoders 426 will now be described in greater detail.

Figure 8:
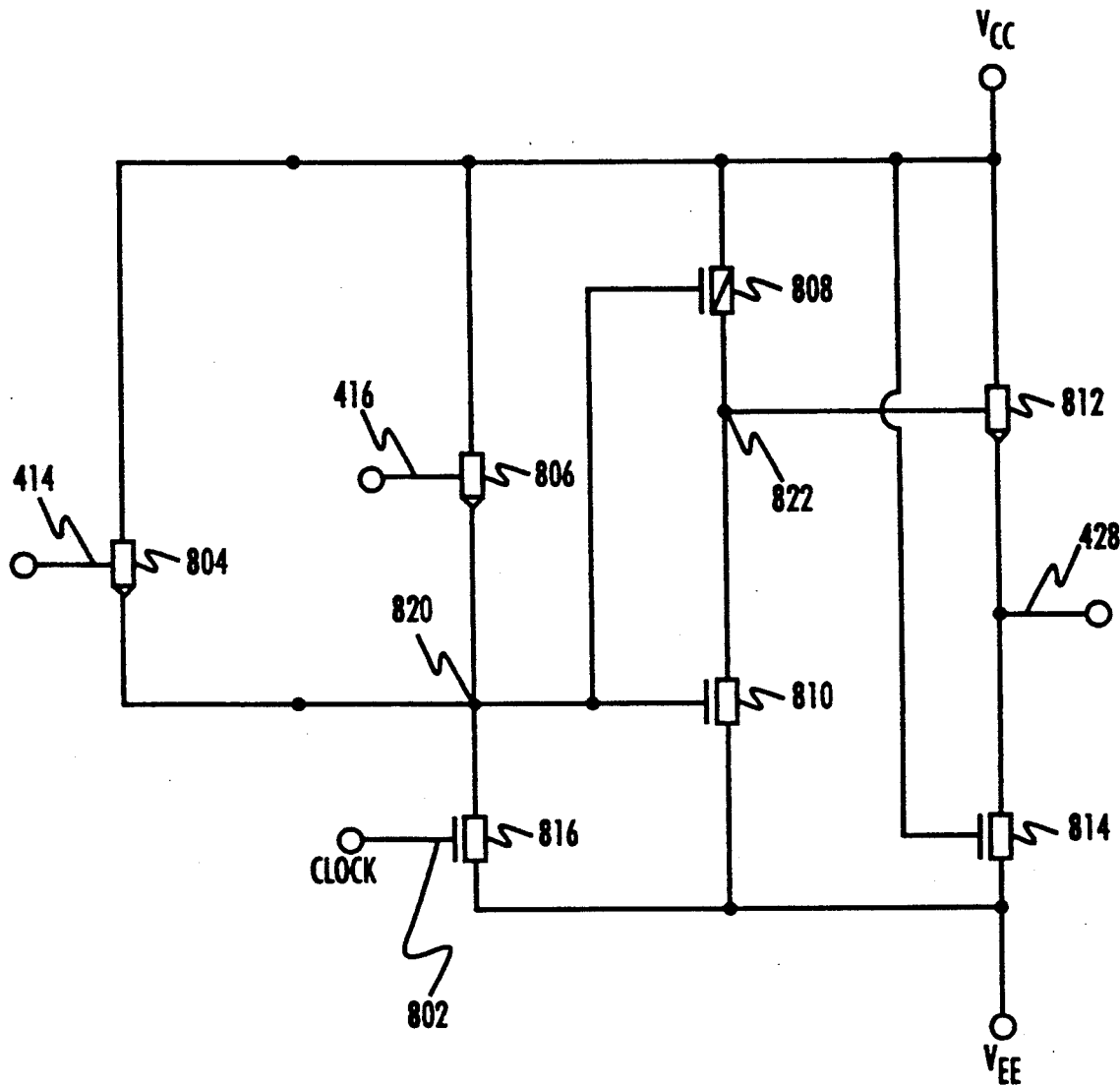
FIG. 8 illustrates a first embodiment of a second decoder of the present invention.

FIG. 8 illustrates a first embodiment of the second decoder 426 according to the present invention.

The second decoder 426 has input lines 414, 416 and word line 428. In operation, if the voltage level on at least one of the input lines 414, 416 is high, then the second decoder 426 maintains its word line 428 at an unenabled state. If the voltage level on both of the input lines 414, 416 is low, then the second decoder 426 enables its word line 428.

As shown in FIG. 8, the second decoder 426 contains bipolar transistors 804, 806, 812 and FETs 808, 810, 814, 816. Thus, the second decoder 426 is implemented using bifet technology.

The bipolar NPN transistors 804, 806 collectively operate as an OR gate (or equivalently, a negative AND gate). If at least one of the input lines 414, 416 is high, then the voltage at node 820 is high. If both of the input lines 414, 416 are low, then the voltage at node 820 is low.

Transistor 808 is a PFET/CMOS transistor. Transistor 810 is a NFET/CMOS transistor. The CMOS transistors 808, 810 collectively operate as an inverter, with node 822 representing the output of the inverter. The gates of the CMOS transistors 808, 810 are connected to node 820, or equivalently, to the output of the OR gate formed by transistors 804, 806. If the voltage at node 820 is low, then the voltage at node 822 is high. Similarly, if the voltage at node 820 is high, then the voltage at node 822 is low.

The bipolar NPN transistor 812 is an emitter follower. The base of the transistor 812 is connected to node 822. Thus, if the voltage at node 822 is high, then the voltage at the word line 428 is high. Similarly, if the voltage at node 822 is low, then the voltage at the word line 428 is low.

Transistor 814 is an NFET pull-down transistor. The transistor 814 helps to quickly and completely pull down the voltage at word line 428 when the voltage at node 822 is low.

The NFET transistor 816 performs two functions. First, the transistor 816 activates and deactivates the decoder 426 in response to the voltage at a clock input 802. Second, the transistor 816 minimizes power dissipation in the decoder 426.

As shown in FIG. 8, the gate of transistor 816 is connected to the clock input 802. When the clock input 802 is low, the transistor 816 is inactive. In this state, current will not flow through transistors 804, 806, 812, notwithstanding the values at the input lines 414, 416. Also, power is not dissipated in transistors 804, 806, 812. Thus, when the clock input 802 is low, the transistor 816 deactivates the decoder 426 and minimizes the power dissipation in the decoder 426.

When the clock input 802 is high, the transistor 816 is active. While the transistor 816 is active, current may flow in transistors 804, 806, 812 depending on the voltages present on the inputs 414, 416. As a result, the transistor 816 activates the decoder 426 when the clock input 802 is high.

Note that the operation of the first decoder 404 and the second decoders 426 with respect to clock signals is different. Specifically, the first decoder 404 is activated when the clock input 450 is low and deactivated when the clock input 450 is high. Conversely, the second decoders 426 are activated when the clock input 802 is high and deactivated when the clock input 802 is low. Thus, either two clock signals or a single clock signal and an inverter are required to operate the decoder embodiment 450 shown in FIG. 4.

The collective operation of the decoder 426 will now be described in detail.

In the preferred embodiment of the present invention, the voltages at the input lines 414, 416 are at ECL-compatible levels (that is, from approximately +0.5 volts to −1.3 volts). Also, $V_{cc}$ is set at +1.4 volts and $V_{ee}$ is set at −2.2 volts. Based on these values of $V_{CC}$ and $V_{EE}$, CMOS levels range from +1.4 volts to −2.2 volts. CMOS-compatible levels range from approximately +0.6 volts to −2.2 volts.

Assume the clock input 802 is high.

If at least one of the input lines 414, 416 is high (that is, at the high end of the ECL-compatible voltage range, or approximately +0.5 volts), then the voltage at node 820 is high. In the preferred embodiment of the present invention, the voltage at node 820 ranges from approximately −0.3 volts to −2.1 volts.

In response to a high voltage at node 820, the inverter formed by transistors 808, 810 outputs a low voltage at node 822. In addition to operating as an inverter, the transistors 808, 810 also collectively operate as a voltage amplifier. In the preferred embodiment of the present invention, the voltages at node 822 are at CMOS levels (that is, from approximately +1.4 volts to −2.2 volts).

In response to the low voltage at node 822, the emitter follower 812, with the aid of the pull-down transistor 814, pulls the word line 428 down to a low voltage, such that the word line 428 is disabled. In the preferred embodiment of the present invention, the voltages at word line 428 are at CMOS-compatible levels (that is, from approximately +0.6 volts to −2.2 volts). Also, the voltage drop from the collector to the emitter ($V_{CE}$) of transistor 812 is approximately 0.8 volts (this is generally true for all the bipolar transistors 804, 806, 812).

If both of the input lines 414, 416 are low (that is, at the low end of the ECL-compatible voltage range, or approximately −1.3 volts), then the voltage at node 820 is low (approximately −2.1 volts).

In response to a low voltage at node 820, the inverter formed by transistors 808, 810 outputs a high voltage (that is, a voltage at the high end of the CMOS voltage range, or approximately +1.4 volts) at node 822.

In response to the high voltage at node 822, the emitter follower 812 pulls the word line 428 up to a high voltage (that is, a voltage at the high end of the CMOS-compatible voltage range, or approximately +0.6 volts), such that the word line 428 is enabled.

It is well known in the art that bipolar transistors have low output impedances. Thus, the emitter follower 812 is capable of driving a physically long word line 428 upon which multiple CMOS devices may be attached.

The input lines 402, 438 are at ECL levels. The input lines 414, 416 are at ECL-compatible levels. The word lines 428 are at CMOS-compatible levels. Therefore, the decoder 440 in general, and the second decoders 426, in particular, provides conversion from ECL and ECL-compatible levels to CMOS-compatible levels.

The inverter formed by the CMOS transistors 808, 810 is required to drive only the base of transistor 812. Bipolar transistors have high input impedance. Therefore, the delay associated with the CMOS transistor 808, 810 is small. The use of bipolar transistors with FETs negates the slow performance of FETs and enhances the overall performance of the second decoder 426

As noted above, the NFET transistor 816 minimizes power dissipation in the second decoder 426 while the second decoder 426 is inactive (that is, while the clock input 802 is low). Thus, the use of FETs with bipolar transistors negates the power dissipation problems of bipolar transistors and enhances the overall power efficiency of the second decoder 426.

However, the NFET transistor 816 does not completely eliminate power dissipation in the second decoder 426 while the second decoder 426 is inactive. Referring again to FIG. 8, when the clock input 802 is low, the PFET transistor 816 is inactive and nonconductive. If the voltage level on at least one of the input lines 414, 416 is high, then the voltage at node 820 is high (approximately −0.3 volts). The threshold voltage of the transistor 808 is approximately −0.9 volts. Since FETs are voltage-controlled devices (rather than current-controlled devices such as bipolar transistors), cross current flows in transistor 808 between drain and source, even when the voltage at node 820 is high. Thus, the second decoder 426 dissipates power at all times, even when it is inactive.

However, since current flows through transistor 808 at all times, the delay in switching the transistor 808 from a (partially) inactive state to an active state is decreased. Thus, the overall performance of the second decoder 426 is enhanced.

Figure 9:
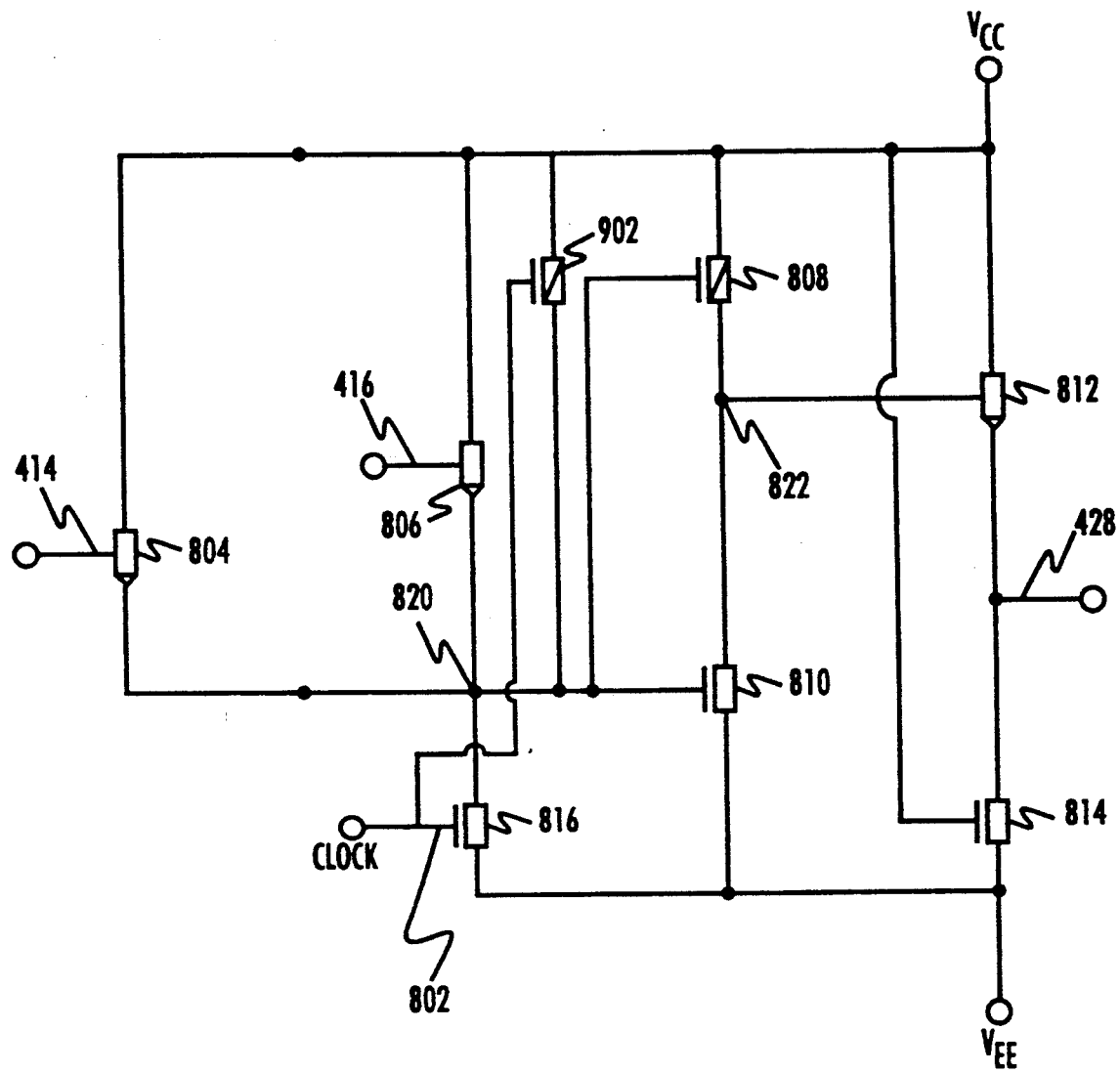
FIG. 9 illustrates a second embodiment of a second decoder of the present invention.

FIG. 9 illustrates a second embodiment of the second decoder 426'. The second embodiment 426' solves the power dissipation problem of the first embodiment 426, in that the second embodiment 426' dissipates power only when the second decoder 426' is activated.

Structurally, the second embodiment 426' is the same as the first embodiment 426 except for a PFET transistor 902 and related connections.

Operationally, the second embodiment 426' is the same as the first embodiment 426 except for its operation when the clock input 802 is low.

Specifically, when the clock input 802 is low, the transistor 816 is inactive and the second decoder 426' is deactivated. The transistor 902, however, is fully active, thereby forming a conductive circuit from $V_{CC}$ to node 820. As a result, the voltage at node 820 is pulled-up to $V_{CC}$ and transistor 808 is completely nonconductive. Since the transistor 808 is nonconductive, cross current does not flow (and power is not dissipated) while the second decoder 426' is deactivated.

When the clock input 802 is high, the transistor 902 does not affect the operation of the second decoder 426' since it is nonconductive.

While various embodiments of the present invention have been described above, it should be understood that they have been presented by way of example only, and not limitation. For example, specific voltage levels were used to illustrate the operation of the present invention. However, the present invention is operable with compatible voltage levels (that is, voltage levels in approximately the same ranges as those mentioned). Thus, the breadth and scope of the present invention should not be limited by any of the above-described exemplary embodiments, but should be defined only in accordance with the following claims and their equivalents.

What is claimed is:

1. A decoder implemented using bifet technology to exhibit high performance, high density, and low power dissipation, said decoder having multiple input lines for conducting signals at ECL-compatible voltage levels and an output line for conducting signals at CMOS-compatible voltage levels, for enabling said output line in response to a predetermined combination of ECL-compatible voltage level signals on said input lines, said decoder comprising:
   gate means for generating an OR output according to said input line signals;
   an inverter coupled to said gate means for inverting and amplifying said OR output to produce an inverted output at CMOS voltage levels;
   a word line driver coupled to an output of said inverter for isolating and driving said output line according to said inverted output; and
   power saving means coupled to said gate means and said inverter for minimizing power dissipation in said decoder.

2. The decoder of claim 1, further comprising a clock signal for activating and deactivating said decoder.

3. The decoder of claim 1, wherein said gate means comprises a plurality of bipolar transistors coupled to said input lines and a gate output node to provide said OR output.

4. The decoder of claim 3, wherein said plurality of bipolar transistors are NPN transistors whose bases are connected to said input lines and whose emitters are connected together at said gate output node.

5. The decoder of claim 1, wherein said inverter comprises field effect transistor means having an input connected to said OR output.

6. The decoder of claim 5, wherein said field effect transistor means comprises a PFET transistor and an NFET transistor connected in series and having their gates connected together at said OR output.

7. The decoder of claim 1, wherein said word line driver comprises a bipolar transistor coupled to said inverted output and said output line.

8. The decoder of claim 7, wherein said bipolar transistor is an NPN transistor whose base is connected to said inverted output and whose emitter is connected to said output line.

9. The decoder of claim 7, wherein said word line driver further comprises a field effect transistor for pulling down said output line to a low CMOS-compatible voltage level when said inverted output is at a low CMOS voltage level.

10. The decoder of claim 9, wherein said field effect transistor is an NFET transistor whose drain is connected to said output line.

11. The decoder of claim 2, wherein said power saving means comprises a field effect transistor having an input connected to said clock signal.

12. The decoder of claim 11, wherein said field effect transistor is an NFET transistor whose gate is connected to said clock signal and whose drain is connected to said OR output.

13. The decoder of claim 2, further comprising a second power saving means for eliminating cross current in said inverter when said decoder is inactive.

14. The decoder of claim 13, wherein said second power saving means comprises a PFET transistor whose gate is connected to said clock signal and whose source is connected to said OR output.

15. An N-to-$2^N$ decoder implemented using bifet technology to exhibit high performance, high density, and low power dissipation, said decoder having N address lines for conducting signals at ECL voltage levels and $2^N$ word lines for conducting signals at CMOS-compatible voltage levels, for enabling said word lines according to predetermined combinations of ECL voltage level signals on said address lines, said decoder comprising:
   a first decoder for translating a binary address on said address lines to a hexidecimal value; and
   $2^N$ second decoders for translating said hexidecimal value to a decimal value by enabling one of said word lines, each of said second decoders comprising:
   multiple input lines for receiving said hexidecimal value;
   an output line corresponding to one of said word lines;
   gate means for generating an OR output according to said hexidecimal value;

an inverter coupled to said gate means for inverting and amplifying said OR output to produce an inverted output at CMOS voltage levels;

a word line driver coupled to an output of said inverter for isolating and driving said output line according to said inverted output; and power saving means coupled to said gate means and said inverter for minimizing power dissipation in said decoder.

16. The decoder of claim 15, wherein said first decoder comprises:

a clock signal for activating and deactivating said first decoder; and two decoders each having $2^N/2$ second output lines for enabling two of said second output lines according to said binary address.

17. The decoder of claim 15, wherein said gate means comprises a plurality of bipolar transistors coupled to said input lines and a gate output node to provide said OR output.

18. The decoder of claim 17, wherein said plurality of bipolar transistors are NPN transistors whose bases are connected to said input lines and whose emitters are connected together at said gate output node.

19. The decoder of claim 15, wherein said inverter comprises field effect transistor means having an input connected to said OR output.

20. The decoder of claim 19, wherein said field effect transistor means comprises a PFET transistor and an NFET transistor connected in series and having their gates connected together at said OR output.

21. The decoder of claim 15, wherein said word line driver comprises a bipolar transistor coupled to said inverted output and said output line.

22. The decoder of claim 21, wherein said bipolar transistor is an NPN transistor whose base is connected to said inverted output and whose emitter is connected to said output line.

23. The decoder of claim 21, wherein said word line driver further comprises a field effect transistor for pulling down said output line to a low CMOS-compatible voltage level when said inverted output is at a low CMOS voltage level.

24. The decoder of claim 23, wherein said field effect transistor is an NFET transistor whose drain is connected to said output line.

25. The decoder of claim 15, further comprising a clock signal for activating and deactivating said second decoders.

26. The decoder of claim 25, wherein said power saving means comprises a field effect transistor having an input connected to said clock signal.

27. The decoder of claim 26, wherein said field effect transistor is an NFET transistor whose gate is connected to said clock signal and whose drain is connected to said OR output.

28. The decoder of claim 25, further comprising a second power saving means for eliminating cross current in said inverter when said second decoders are inactive.

29. The decoder of claim 28, wherein said second power saving means comprises a PFET transistor whose gate is connected to said clock signal and whose source is connected to said OR output.

* * * * *

UNITED STATES PATENT AND TRADEMARK OFFICE
CERTIFICATE OF CORRECTION

PATENT NO. : 5,283,481
DATED : February 1, 1994
INVENTOR(S) : Klimanis, et. al.

It is certified that error appears in the above-indentified patent and that said Letters Patent is hereby corrected as shown below:

On the Title page, under Assignee, item [73] replace *Notice "July 14, 2009" with -- April 28, 2009--.

Signed and Sealed this

Eleventh Day of October, 1994

BRUCE LEHMAN

Attest:

*Attesting Officer*          *Commissioner of Patents and Trademarks*